(12) United States Patent
Kiyofuji et al.

(10) Patent No.: US 7,458,818 B2
(45) Date of Patent: Dec. 2, 2008

(54) ELECTRIC CONNECTOR AND ELECTRICAL CONNECTING APPARATUS USING THE SAME

(75) Inventors: Hidehiro Kiyofuji, Aomori (JP); Naoki Suto, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 11/940,282

(22) Filed: Nov. 14, 2007

(65) Prior Publication Data

US 2008/0139017 A1  Jun. 12, 2008

(30) Foreign Application Priority Data

Dec. 8, 2006  (JP) .............................. 2006-332031

(51) Int. Cl.
*H01R 12/00* (2006.01)
(52) U.S. Cl. ............................. 439/66; 324/761; 439/92
(58) Field of Classification Search .................. 439/66, 439/700, 824, 92, 101; 324/761
See application file for complete search history.

(56) References Cited

U.S. PATENT DOCUMENTS

RE34,084 E * 9/1992 Noschese ..................... 439/66
6,416,331 B1 * 7/2002 Shimizu ....................... 439/66
6,638,077 B1 * 10/2003 Fan et al. ....................... 439/66
7,102,373 B2 * 9/2006 Yoshida ....................... 324/755
7,255,575 B2 * 8/2007 Hasegawa ..................... 439/71
2006/0046533 A1 * 3/2006 Okamoto et al. .............. 439/74

FOREIGN PATENT DOCUMENTS

JP  08-139142  5/1996

* cited by examiner

*Primary Examiner*—Tho D Ta
(74) *Attorney, Agent, or Firm*—Ingrassia Fisher & Lorenz, P.C.

(57) ABSTRACT

An electrical connecting device is disposed between a circuit board and a probe board opposing each other and used for connection between electrical connection terminals provided on the underside of said circuit board and electrical connection terminals provided on the probe board. In the electrical connecting device, an electrical insulating board has at least one of conductive earth patterns to be maintained at the earth potential on at least one selected from groups including the upside, underside and inside of the electrical insulating plate; a connecting pin disposed in each through hole of a first group is connected to the earth pattern, while a connecting pin disposed in each through hole of a second group is electrically separated from the earth pattern.

12 Claims, 11 Drawing Sheets

ELECTRIC CONNECTOR AND ELECTRICAL CONNECTING APPARATUS USING THE SAME

TECHNICAL FIELD

The present invention relates to an electrical connecting device for connecting electrical connection terminals disposed between a circuit device and a probe board to be provided on the circuit board and electrical connection terminals provided on the probe board, and an electrical connecting apparatus using the same.

BACKGROUND

An electric performance test, i.e., test of a circuit board (to be called "device under test" in the present invention) such as a semiconductor integrated circuit is conducted by using an electrical connecting apparatus such as a probe card provided in a tester.

There is one of such an electrical connecting apparatus in which an electrical connecting device is disposed between a circuit board and a probe board opposing each other, and which electrical connection terminals provided on the circuit board and electrical connection terminals provided on the probe board are connected each other by means of the electrical connecting device (Patent Document 1).

In such an electrical connecting apparatus, the electrical connecting device includes an insulating board having a plurality of through holes penetrating the insulating board in its thickness direction, and a pogo pin is disposed in each through hole as a connecting pin, the connection terminals of the circuit board and the connection terminals of the probe board being connected in one-to-one correspondence. The probe board has a plurality of contacts which correspond to the connecting pins in one-to-one relationship and which are pressed against the electrical connection terminals of a device under test.

The above-mentioned conventional electrical connecting apparatus conducts a test while pressing each contact provided on the probe board against the connection terminal of the device under test, by supplying the power to the device under test through the connecting pins and contacts and loading signals from the device under test to the tester through the contacts and connecting pins. When testing, the connecting pins and contacts are divided into three kinds, that is, for earth, for a positive or a negative source, and for signal and used.

Patent Document 1—Japanese Patent Appln. Public Disclosure No. 8-139142

However, since the connecting pin has a large length dimension, external noises tend to get mixed in a signal passing the connecting pin. Particularly, as an weak electric signal from a device under test passes the connecting pin for signal, it is not possible to conduct an accurate test of the device under test if a noise gets mixed in such an imperceptible electric signal.

BRIEF SUMMARY

An object of the present invention is to restrain external noises from mixing in an electric signal passing a connecting pin for signal.

An electrical connecting device according to the present invention is disposed between a circuit board and a probe board opposing each other and used for connection of electrical connection terminals provided on the underside of the circuit board and electrical connection terminals provided on the upside of the probe board.

Such an electrical connecting device includes: an electrical insulating plate having at least a first and a second groups each including a plurality of through holes penetrating said electrical insulating plate in its thickness direction; and a plurality of conductive connecting pins, each of the pins being disposed in each through hole, and having the upper end portion projecting from the insulating plate in the upward direction and the lower end portion projecting from the insulating plate in the upward direction.

In the above-mentioned electrical connecting device, the electrical insulating plate further has at least one of conductive earth patterns on at least one of the upside, underside and inside of said electrical insulating plate; the connecting pin disposed in each through hole of said first group is connected to said earth pattern; and the connecting pin disposed in each through hole of said second group is electrically separated from said earth pattern.

The insulating plate may has the earth pattern formed on each of the upside, underside, and those earth patterns may be electrically connected to each other.

The insulating plate may further include a conductive film formed in the inner surface of at least one of the through holes of the first group and connected to the earth pattern, and the connecting pin disposed in each through hole of the first group may be in contact with the conductive film.

The insulating plate may has the earth pattern formed on each of the upside and underside of the electrical insulating plate, and those earth patterns may be electrically connected to each other.

The electrical connecting device may further have a capacitor accommodated in at least one of the lower part, the inner part and the upper part of the electrical insulating plate, and each capacitor may be electrically connected to the connecting pin disposed in a part of the through hole of the second group and to the earth pattern.

Each connecting pin may be provided with: a cylindrical member; a first pin member disposed at one end portion of the cylindrical member movably in the longitudinal direction; and a compression coil spring disposed within the cylindrical member to energize the first pin member in a direction that its tip end portion projects from the one end portion of the cylindrical member.

Each connecting pin can be further provided with a second pin member disposed at the other end portion of the cylindrical member movably in the longitudinal direction of the cylindrical member, and the compression coil spring may be disposed between the first and second pin members to further energize the second pin member in a direction that its tip end portion projects from the other end portion of the cylindrical member.

The electrical connecting apparatus according to the present invention is used for connecting the tester to the electrical connection terminals of the device under test to undergo an electrical test by the tester.

Such an electrical connecting apparatus comprises: a circuit board with a plurality of wiring circuits to be connected to the tester and an electrical connection terminal of each wiring circuit formed on the underside; a flat plate-like probe board having an upside and an underside, the upside opposing the underside of the circuit board, having on the upside a plurality of electrical connection terminals opposing the connection terminals of the circuit board, a plurality of contacts provided on the underside of the probe board, each contact being connected to the connection terminals of device under test, and the tip end portion of each contact being able to abut the connection terminals of said probe board; and an electrical connecting device as mentioned above which is disposed between the circuit board and the probe board to connect the connection terminals of the circuit board to the corresponding contacts.

The electrical connecting apparatus can further comprise: a support member disposed on the circuit board, and a thermal deformation restraining member disposed on the support member so as to restrain thermal deformation of the support member and having a thermal expansion coefficient greater than that of the support member.

The thermal deformation restraining member may be combined with the support member by a plurality of screw members penetrating the thermal deformation restraining member.

In the foregoing electrical connecting apparatus, the electrical connecting device may be supported on the support member through a plurality of screw members penetrating the electrical connecting device and the circuit board to be screwed into the support member.

The electrical connecting apparatus may further comprise: a base ring having a central opening to receive the electrical connecting device and disposed on the underside of the circuit board; and a fixed ring having a central opening to receive the probe board and disposed on the underside of the base ring by means of a plurality of screw members penetrating the fixed ring and screwed into the base ring, and the probe board may be sandwiched between the base ring and the fixed ring.

The base ring and the fixed ring may be supported on the support member through a plurality of the screw members penetrating the support member and the circuit board and screwed into the base ring.

The electrical connecting device according to the present invention has a conductive earth pattern on at least one selected from a group including the upside, underside and inside of the electrical insulating plate, the connecting pin disposed in each through hole of a first group is connected to the earth pattern, and the connecting pin disposed in each through hole of a second group is electrically separated from the earth pattern.

Thus, the connecting pin disposed in each through hole of the second group is electrically shielded from its external by the earth pattern, so that, for example, the connecting pin disposed in each through hole of the first group can be used as a connecting pin for earth, and the connecting pin disposed in each through hole of the whole or a part of the second group can be used for a signal. As a result, according to the present invention, external noises are restrained and prevented from mixing into an electrical signal passing the connecting pin for signal.

If the earth pattern is formed on each of the upside and underside of the insulating plate, external noises are surely restrained and surely prevented from mixing into an electric signal passing the connecting pin for signal.

If the electrical insulating plate further includes a conductive film formed on the inner surface of each through hole of the first group, and if the connecting pin disposed in each through hole of the first group is in contact with the conductive film, the conductive film can be used as the wiring for connecting the connecting pin disposed in each through hole of the first group to the earth. As a result, it is no longer required to newly form the wiring for connecting the earth connecting pin to the earth.

If the earth pattern is formed on each of the upside, underside and inside of the electrical insulating plate, mixing of external noises into an electric signal passing the signal connecting pin is more surely restrained and more surely prevented.

If the electrical connecting device is further provided with a plurality of capacitors accommodated at least one of in the lower, inside or upper portion of the insulating plate and if each capacitor is electrically connected to the connecting pin disposed in the through hole of a part of the second group and earth pattern, it is possible to make the dimension between the circuit board and the probe board, in turn, the length dimension of the connecting pin smaller than the case where the capacitor is provided on the probe board by such a dimension as the capacitor is accommodated in the insulating plate, thereby decreasing mixing of noises into the electric signal passing the connecting pin for signal. As a result, mixing of noises in the connecting pin for signal is more surely restrained and more surely prevented.

If using the connecting pin disposed in the through hole of a part of the second group is used for positive or negative terminal of the power source and if the connecting pins disposed in the remaining through holes of the second group is used for signal, not only the connecting pins for signal but also the connecting pin for the source is electrically separated from the earth pattern.

If each connecting pin has a cylindrical member, a first pin member disposed at one end portion thereof movably in the longitudinal direction of the cylindrical member, and a compression coil spring disposed within the cylindrical member for energizing the first pin member in a direction that its tip end portion projects from the one end portion of the cylindrical member, the one and the other ends of each connecting pin is pressed against the electrical connection terminal of the circuit board and the electrical connection terminal of the probe board by the compression coil spring to be surely brought into contact with those connection terminals.

DETAILED DESCRIPTION

Definition of Terms

Figure 3:
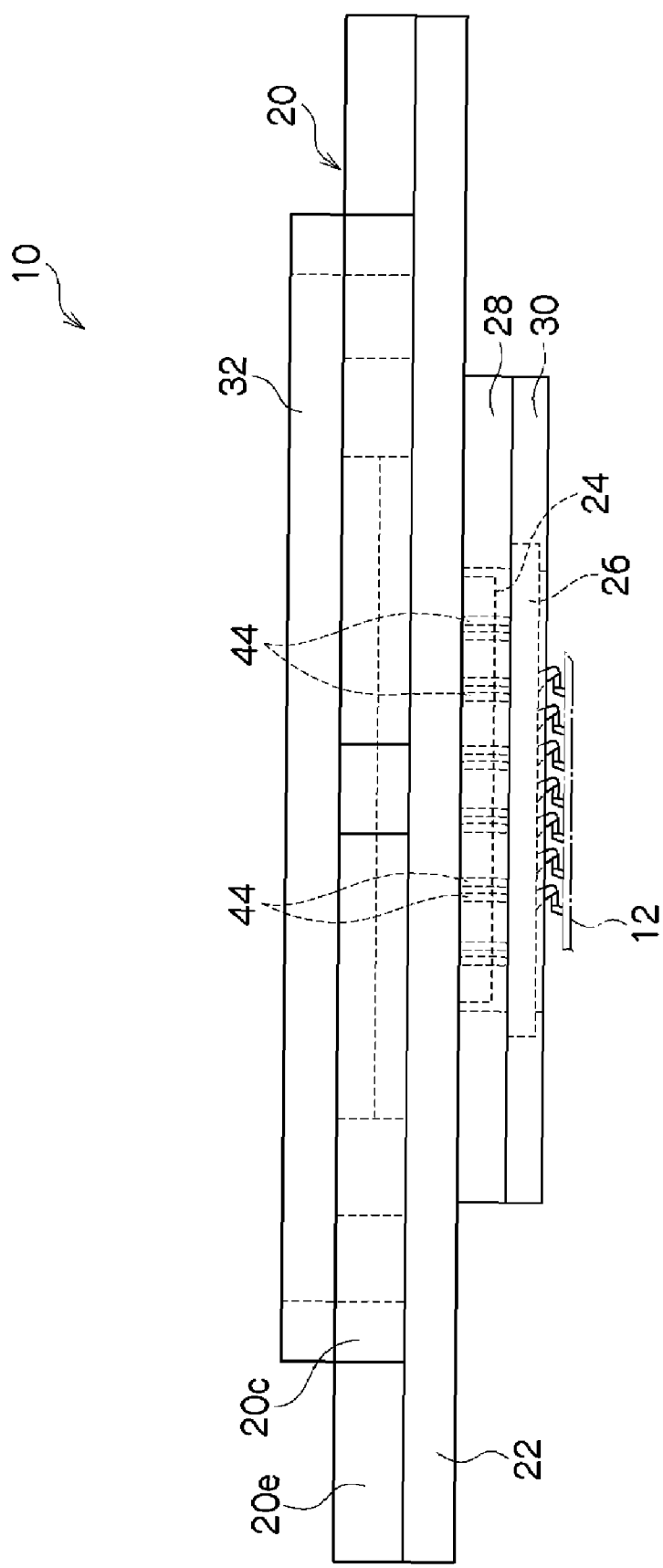
FIG. 3 is a front elevation of the electrical connecting apparatus shown in FIG. 1.
Figure 4:
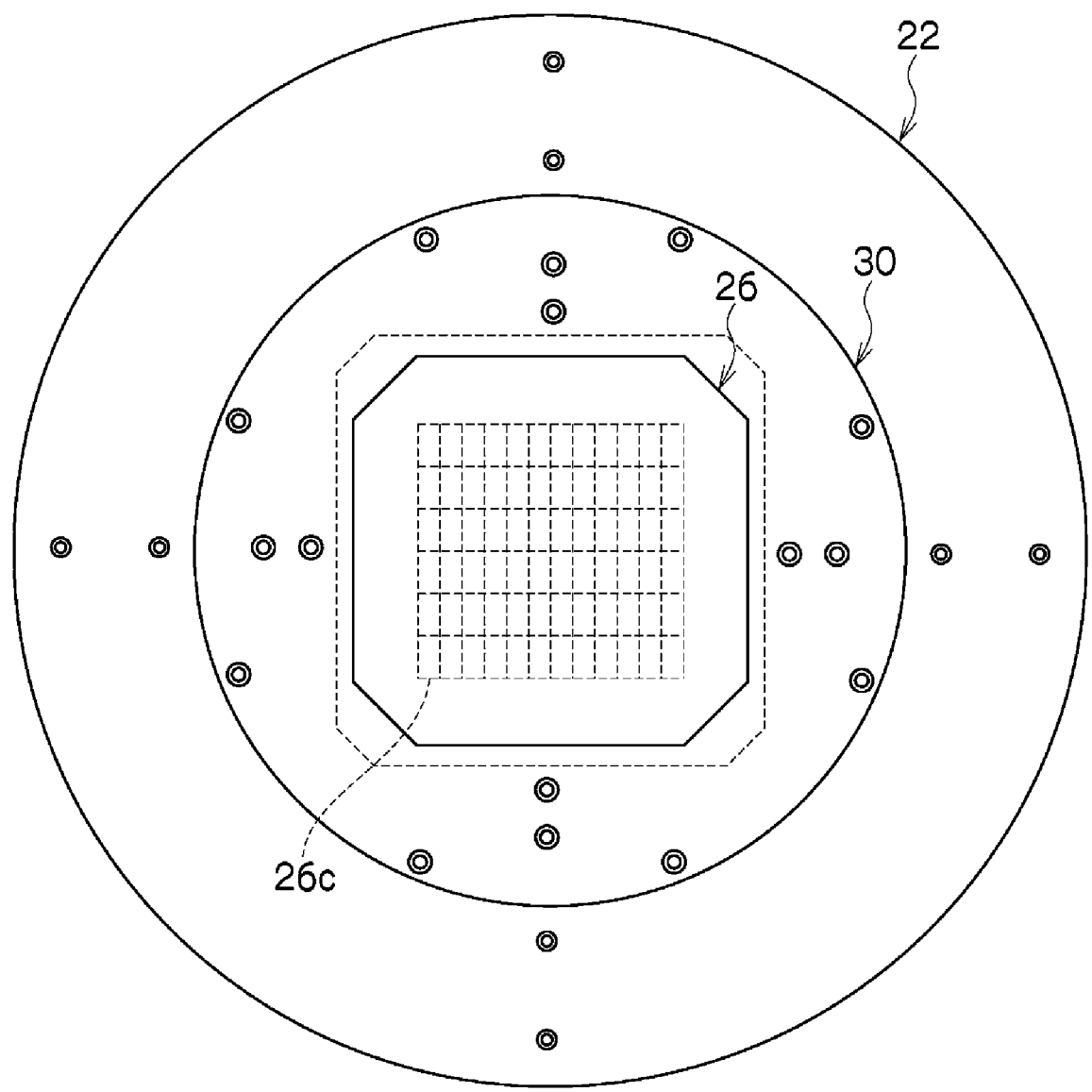
FIG. 4 is a bottom view of the electrical connecting apparatus shown in FIG. 1.

In the present invention, the up-and-down direction means the vertical direction in FIG. 3. However, the up-and-down direction in the present invention differs depending on attitudes of a device under test at the time of inspecting the tester. Thus, the up-and-down direction in the present invention may be determined according to an actual test device to indicate any of the directions of the vertical direction, opposite direction, horizontal direction, and direction of inclination to the horizontal direction.

EMBODIMENT 1

Referring to FIG. 1 through FIG. 5, an electrical connecting apparatus 10 is disposed in a tester (not shown) for testing an integrated circuit as a device under test 12. The device under test 12 may be at least one integrated circuit cut off from a wafer, or may be at least one integrated circuit within a non-cut wafer. The device under test 12 has, in either case, a plurality of electrical connection terminals such as electrode pads on a lower face, i.e., upside.

Figure 1:
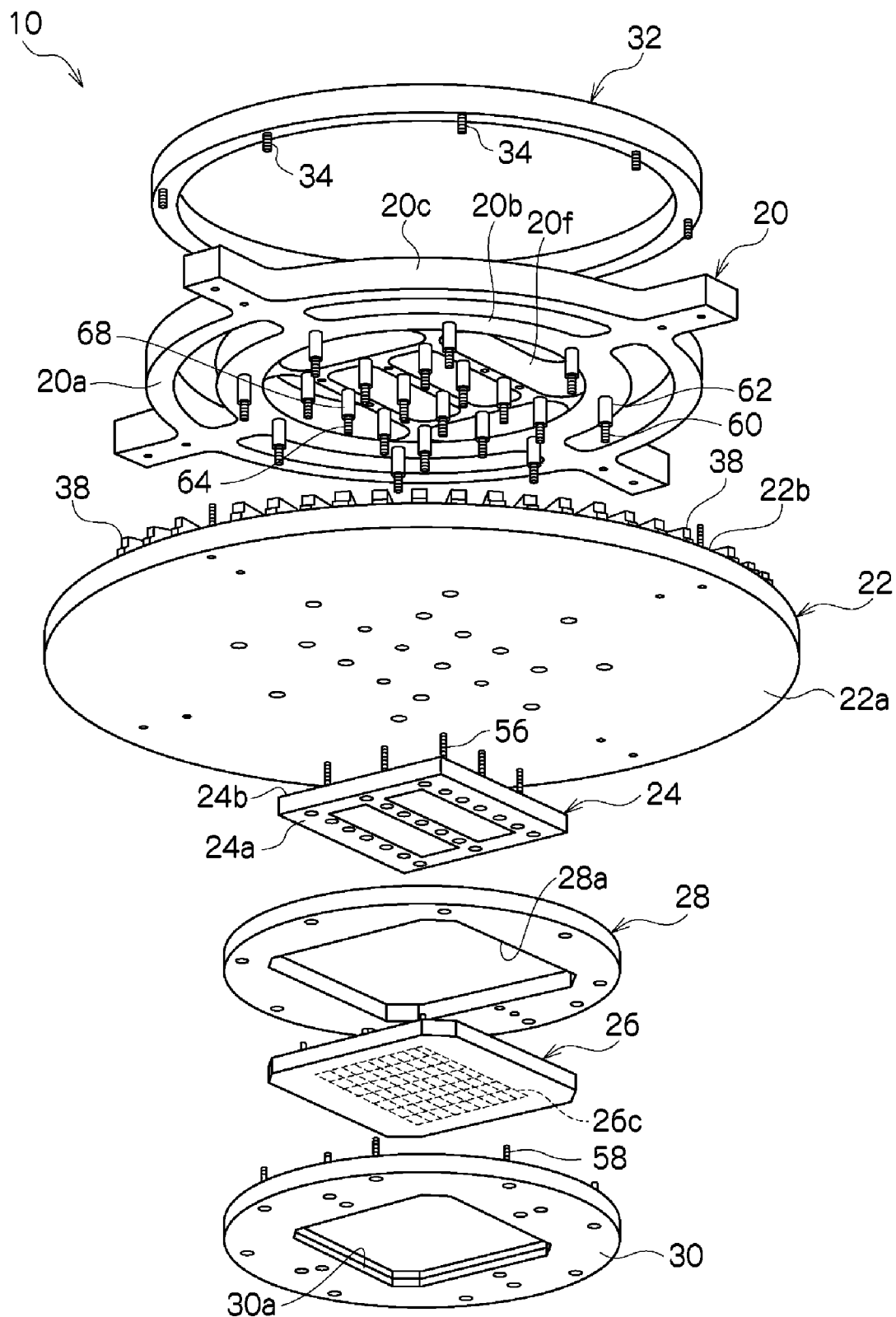
FIG. 1 is an exploded perspective view showing one embodiment of the electrical connecting apparatus according to the present invention.

As shown in FIG. 1, the connecting apparatus 10 comprises: a flat plate-like support member 20 having a lower face or flat underside 20a; a circular flat circuit plate or circular flat circuit board 22 held on the underside 20a of the support member 20; a flat plate-like electrical connecting device 24 disposed on a lower face or underside 22a of the circuit board 22; a probe plate or probe board 26 disposed on a lower face underside 24a of the electrical connecting device 24; a base ring 28 having a rectangular central opening 28a for receiving the electrical connecting device 24; and a fixed ring 30 for sandwiching the edge portion of the probe board 26 together with the edge portion of the central opening 28a of the base ring 28.

The above-mentioned members 20-30 are integrally assembled as explained later.

As shown in FIGS. 1 through 5, the support member 20 is made of a metal material such as a stainless plate and disposed on an upper face, i.e., upside 22b of the circuit board 22 with the underside 20a (see FIG. 1) brought into contact with the upside 22b (see FIG. 1) of the circuit board 22.

Figure 2:
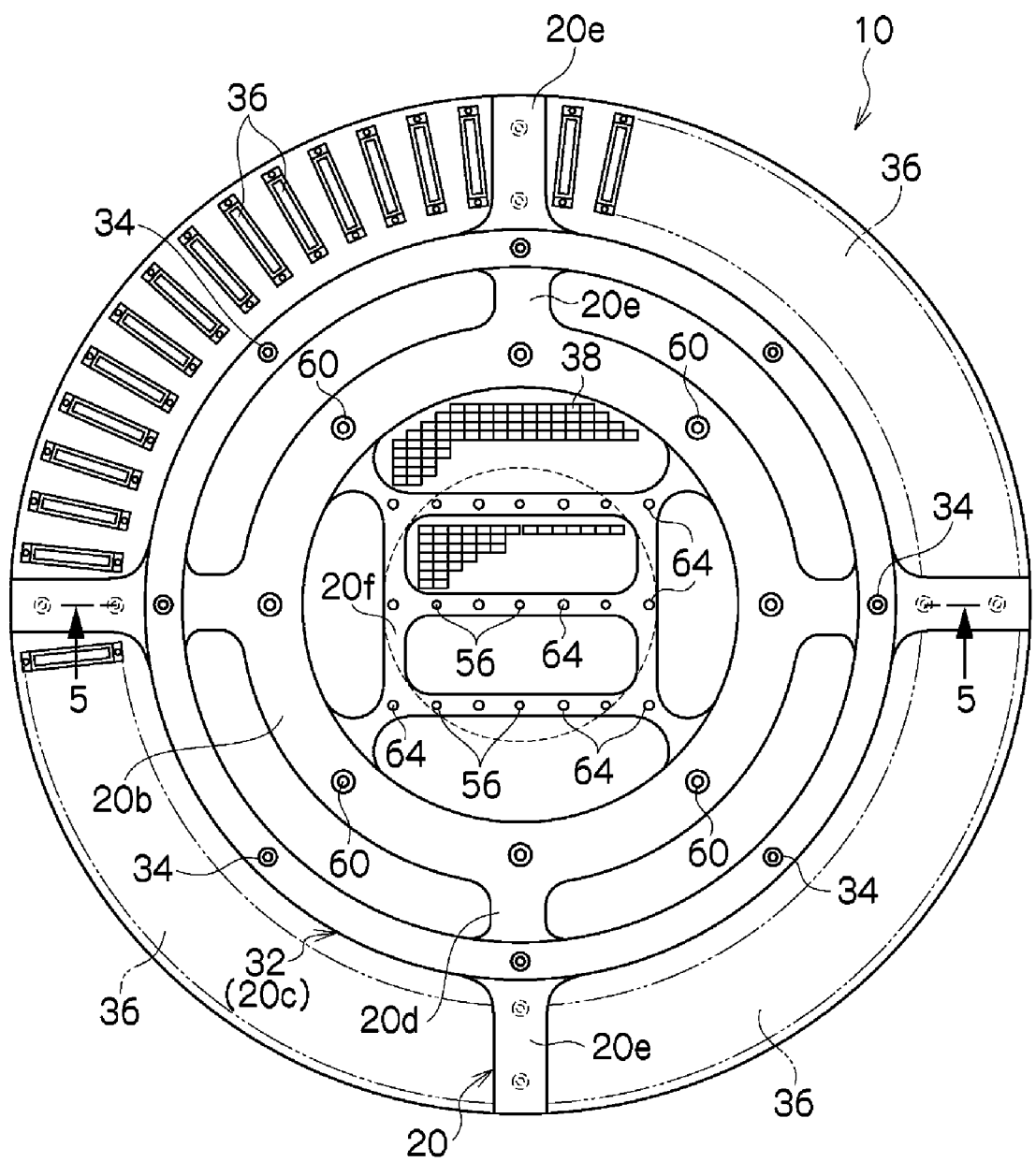
FIG. 2 is a plan view of the electrical connecting apparatus shown in FIG. 1.

The support member 20 has, as shown in FIG. 2, an inner annular portion 20b, an outer annular portion 20c, a plurality of joint portions 20d for joining both annular portions 20b and 20c, an extended portion 20e extending outward from the outer annular portion 20c, and a central frame portion 20f. In the illustration, a thermal deformation restraining member 32 for restraining thermal deformation of the support member 20 is disposed on the upside of the support member 20.

The thermal deformation restraining member 32 is made annular of a material having a thermal expansion coefficient greater than that of the support member 20. The thermal deformation restraining member 32 has approximately the same size as the outer annular portion 20c so as to cover the upside of the outer annular portion 20c of the support member 20, and is assembled into the upside of the outer annular portion 20c by means of a plurality of screw members 34.

In the illustration, the circuit board 22 is made like a circular plate of an electrical insulating resin such as polyimide resin. At an annular periphery of the upside 22b (see FIG. 1) of the circuit board 22 are aligned multiple connectors 36 as shown in FIG. 2 to be connected to the electric circuit of the tester. Each connector 36 has a plurality of terminals (not shown).

In the central portion of the underside 22a (see FIG. 1) of the circuit board 22 are arranged like a rectangular matrix a plurality of electrical connection terminals 22c (see FIG. 7) made to correspond to respective terminals of the connectors 36. As shown in FIG. 2, in the central portion of the upside 22b (see FIG. 1) of the circuit board 22 are a plurality of relays 38 for switching the connection terminals 22c to be connected to the terminals of the connectors 36 according to the contents of test, or for switching off the wiring circuit (not shown) of the circuit board 22 from the connection terminal 22c in case of emergency.

The wiring circuit of the circuit board 22 is formed within the circuit board 22. The terminals of the connectors 36 and the connection terminals 22c can be connected properly to each other through the wiring circuit (not shown) of the circuit board 22 and the relays 38. In the illustration in FIG. 2, the connectors 36 are located outside the outer annular portion 22c of the support member 20, and the relays 38 are located inside the inner annular portion 20b.

Figure 6:
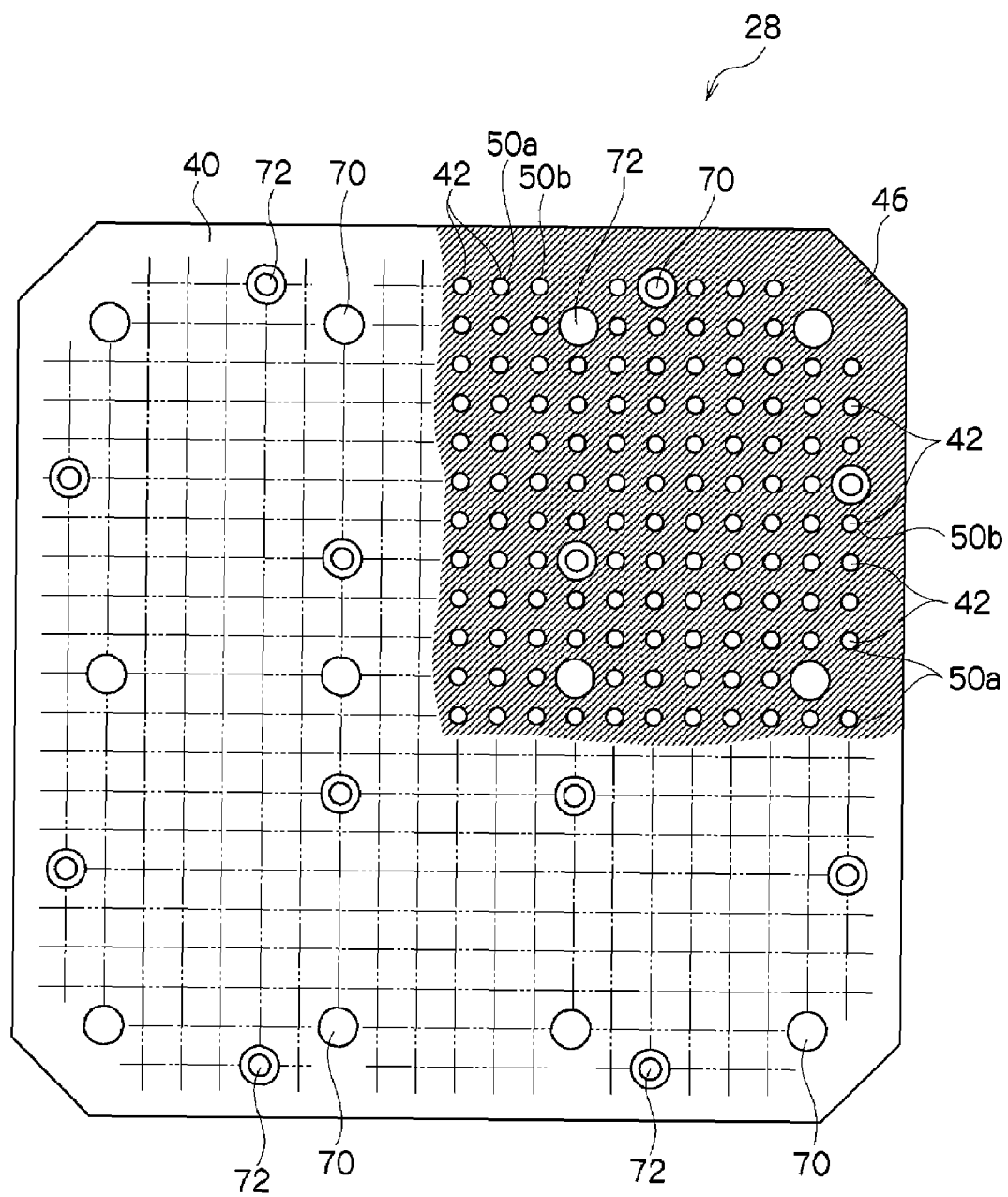
FIG. 6 is a bottom view showing the first embodiment of the electrical connecting device according to the present invention.
Figure 7:
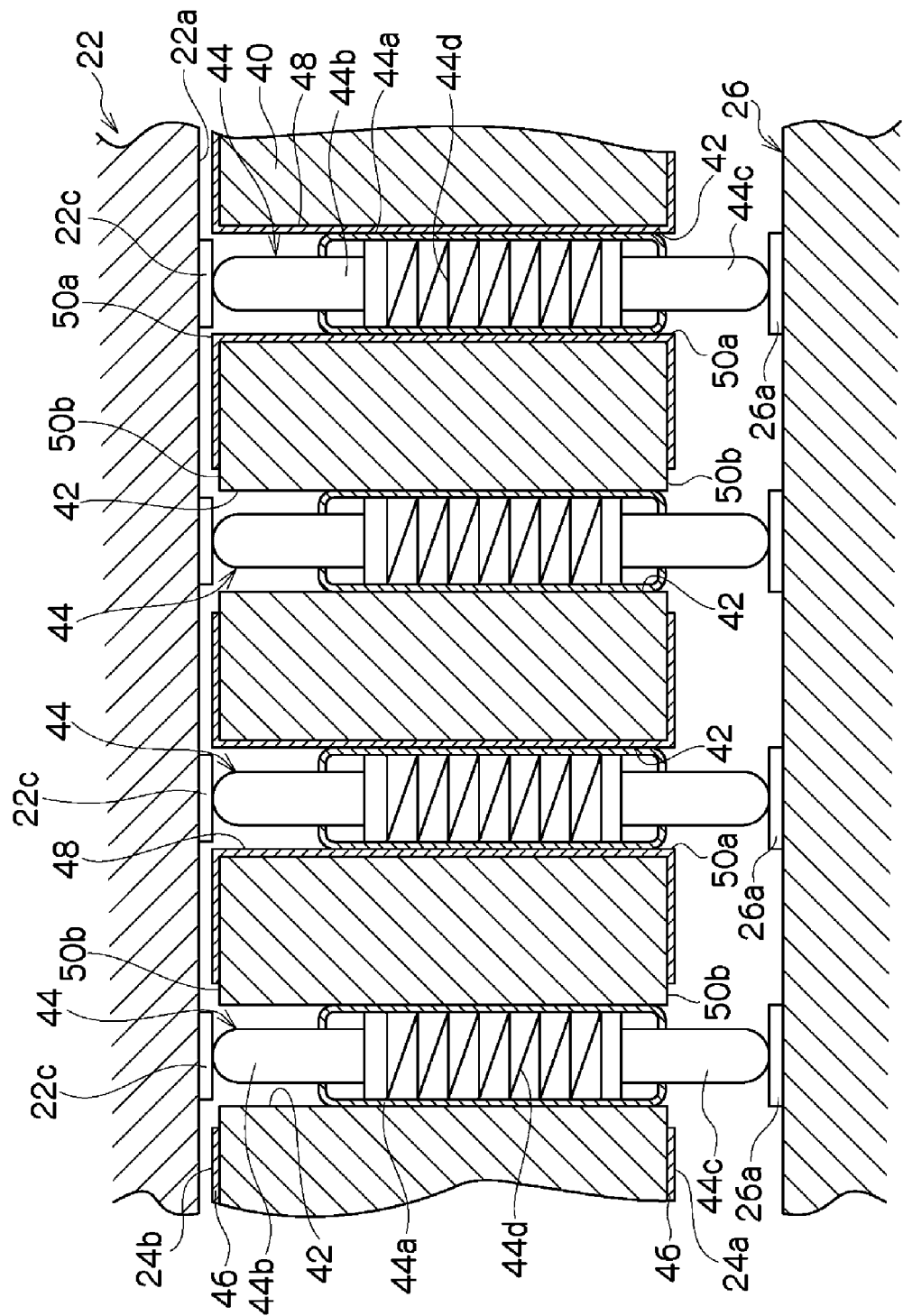
FIG. 7 is an enlarged sectional view of the electrical connecting device shown in FIG. 6.

As shown in FIGS. 6 and 7, the electrical connecting device 24 includes: an electrical insulating plate 40 formed into a rectangular shape sized to be received in the central opening 28a of the base ring 28 by an electrical insulating material such as polyimide resin; multiple through holes 42 formed to penetrate the insulating plate 40 in its thickness direction and made to correspond to the respective connection terminals 22c of the circuit board 22; and a conductive connecting pin 44 disposed in each through hole 42 so as not to drop off.

Each through hole 42 has a circular sectional shape. The multiple through holes 42 belong to either one of a first and a second groups each including plural through holes 42. The plural connecting pins 44 are also divided into at least first and second groups respectively arranged in the corresponding through holes 42.

The connecting pin 44 disposed in each through hole 42 of the first group can be used as an earth connecting pin to be maintained at the earth potential, and a part of the connecting pins 44 disposed in the through holes 42 of the second group can be used as connecting pins 44 to be connected to the positive or negative terminal of the power source. Each of the remaining connecting pins 44 disposed on the through holes 42 of the second group can be used as connecting pins for signal to receive signals from the device under test 12.

As shown FIG. 7, each connecting pin 44 includes: a cylindrical member 44a; a first pin member 44b disposed at one end portion of the cylindrical member 44a movably in the longitudinal direction of the cylindrical member 44a; a second pin member 44c disposed at the other end portion of the cylindrical member 44a movably in the longitudinal direction of the cylindrical member 44a; and a compression coil spring 44d within the cylindrical member 44a disposed between the first and second pin members 44b and 44c to energize in a direction that the tip end portions respectively of the first and second pin members 44b and 44c project from the one end and the other end portions of the cylindrical member 44a (namely, the direction for the first and second pin members 44b and 44c separate from each other).

Each connecting pin 44 is maintained on the electrical insulating plate 40 at the cylindrical member 44a so as not to drop off. The first and second pin members 44b and 44c are held at the cylindrical member 44a so as not to drop off.

The electrical insulating plate 40 has also a conductive earth pattern 46 on each of the upside and underside of the electrical insulating plate 40 and a conductive film 48 on the inner surface of each through hole 42 of the first group.

Both earth patterns 46 and conductive film 48 are electrically connected to each other. Both earth patterns 46 are conductive layers formed by printed wiring technique, photolithography technique and the like and are electrically cut off from each connecting pin 44 disposed in the through hole 42 of the second group.

In other words, each of the earth patterns 46 is integrally combined with the conductive film 48 in a portion 50a around the edge of each through hole 42 of the first group and is cut out into a circular shape larger than each through hole 42 of the second group in a portion 50b around the edge of each through hole 42 of the first group.

As a result, the conductive film 48 is electrically connected to both earth patterns 46, but the connecting pin 44 disposed in each through hole 42 of the second group is electrically separated from the earth pattern 46.

The connecting pin 44 disposed in each through hole 42 of the first group is in contact with the conductive film 48. Thus, as shown in FIG. 7, the connecting pin 44 disposed in each through hole 42 of the first group is electrically connected to both earth patterns 46 through the conductive film 48.

Each first pin member 44b is brought into contact with the connection terminal 22c provided on the circuit board 22, and each second pin member 44c is brought into contact with the electrical connection terminal 26a formed on the upside of the probe board 26 in correspondence to each connection terminal 22c of the circuit board 22. Thus, each connecting pin 44 electrically connects the connection terminal 22c of the circuit board 22 and the connection terminal 26a of the probe board 26 in one-to-one relationship.

The base ring 28 is attached to the underside 22a of the circuit board 22. The central opening 28a of the base ring 28 is somewhat larger than the electrical connecting device 24.

The fixed ring 30 has at its central portion a central opening 30a which allows a contact 52 to be mentioned later of the probe board 26 to be exposed. The lower end portion of the central opening 30a is smaller than the probe board 26, but the remaining portion above the lower end portion of the central opening 30a is sized enough to receive the probe board 26.

The probe board 26 made of an electrical insulating material such as ceramic or polyimide resin to have a rectangular shape. The above-mentioned connection terminal 26a (see FIG. 6) is provided in the upper portion of the probe board 26, and a plurality of probe lands 26a (see FIG. 5) on which the contacts 52 are mounted are provided in the rectangular contact area 26c (see FIG. 4) of the underside of the probe board 26. The connection terminals 26a and the probe lands 26b are electrically connected in one-to-one relationship.

Each contact 52 is of a cantilever type, and is mounted on the probe land 26b with its tip end portion (tip end) projected downward, by adhesion by a conductive adhesive, welding by laser and the like. By this, the respective contacts 52 are electrically connected to the corresponding connection terminals 22c of the circuit board 22 through the wiring circuit of the probe board 26 and the connecting pins 44 of the electrical connecting device 24 in one-to-one relationship.

Such a probe board 26 can be made of a ceramic board (not shown) and a multilayer circuit board (not shown) formed on the underside of the ceramic board. In this case, the connection terminals 26a are provided on the upside of the ceramic board, and the probe lands 26b (see FIG. 5) are provided on the underside of the multilayer circuit board.

The multilayer circuit board is made of an electrical insulating material such as polyimide resin epoxy resin or the like and can have a plurality of wiring paths made to correspond to the set of the connection terminals 26a and probe lands 26b. One end portion of the wiring path of the multilayer ceramic board is connected to the probe land 26b. In this case, the ceramic board has a connection member for electrically connecting the other end portion of the wiring path of the multilayer circuit board and the connection terminal 26a.

The electrical connecting apparatus 10 is assembled in the following manner by using a plurality of screw members.

Figure 5:
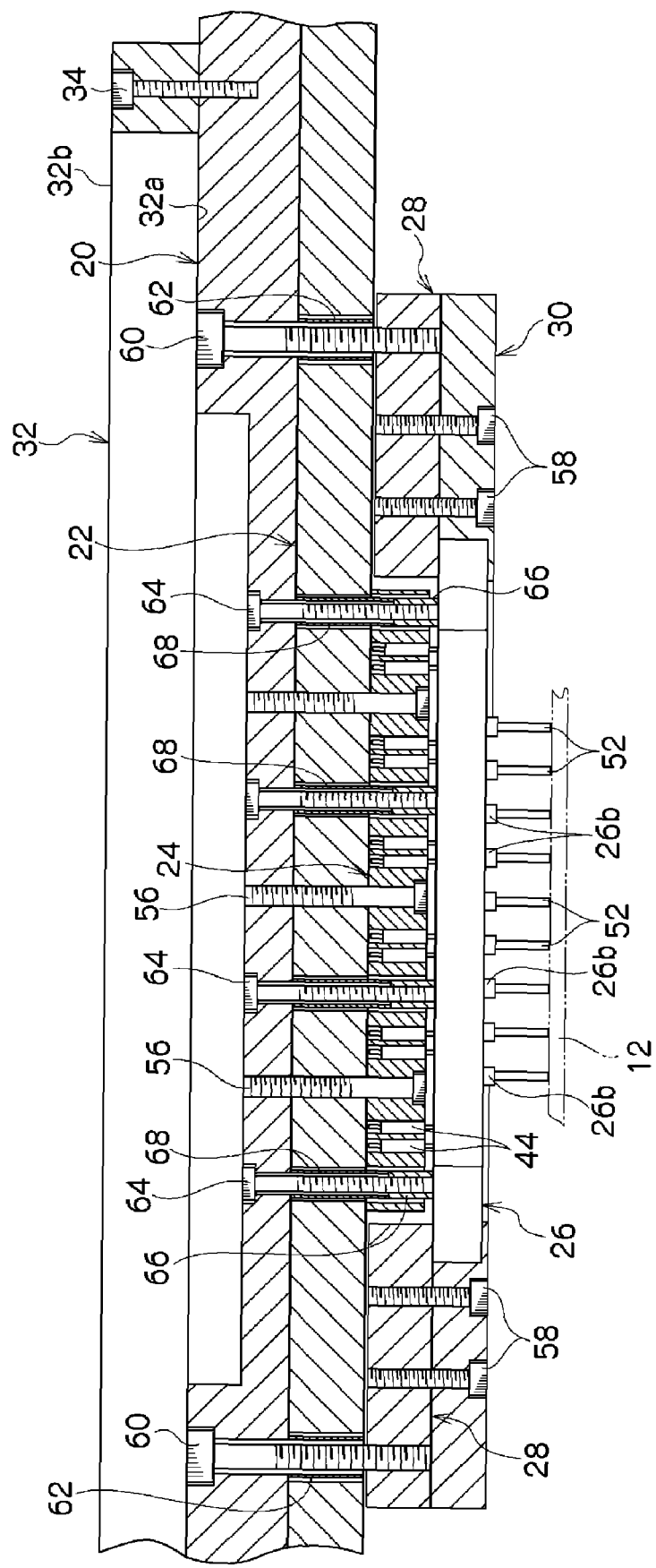
FIG. 5 is a sectional view obtained along the line 5-5 in FIG. 2.

As shown in FIG. 5, the thermal deformation restraining member 32 is mounted on the upside of the outer annular portion 20c by the plural male screw members 34 which penetrate the thermal deformation member 32 from above downward to be screwed into the outer annular portion 20c of the support member 20.

The electrical connecting device 24 is mounted on the outer annular portion 20c of the thermal deformation restraining member 32 by a plurality of male screw members 56 which penetrate the electrical connecting device 24 and circuit board 22 from below upward to be screwed into the support member 20.

The tip end of the male screw member 56, being screwed into the support member 20, serves to make the electrical connecting device 24 and the support member 20 sandwich the circuit board 22.

The base ring 28 and the fixed ring 30 are combined with each other to sandwich the edge portion of the probe board 26 by a plurality of male screw members 58 penetrating the fixed ring 30 from below upward to be screwed into the base ring 28.

The base ring 28 is mounted on the support member 20 by a plurality of male screw members 60 which penetrate the inner annular portion 20 of the support member 20 and the circuit board 22 from above downward to be screwed into the base ring 28. Each screw member 60 penetrates a spacer 62 which penetrates the circuit board 22 in its thickness direction.

Both ends of the spacer 62 abut on the support member 20 and the base ring 28. The spacer 62 maintains the base ring 28 and the fixed ring 30 sandwiching the edge portion of the probe board 26 at a predetermined interval from the underside 20a of the support member 20.

In a state of being assembled into the electrical connecting apparatus 10, the connecting pin 44 disposed in each through hole 42 of the first group is in contact with the conductive film 48 electrically connected to the earth pattern 46. Thus, it is possible to use the earth pattern 46 and the conductive film 48 as the wiring for connecting the connecting pin 44 disposed in each through hole 42 of the first group to the earth, so that there is no need to newly form the wiring for connecting the earth connecting pin to the earth.

Also, in a state of being assembled into the electrical connecting apparatus 10, each first connecting pin 44b and each second connecting pin 44c of the electrical connecting device 24 are respectively press-connected to the connection terminal 22c of the circuit board 22 and the corresponding connection terminal 26a of the probe board 26 by the spring force of its compression coil spring 44d.

By this, each connecting pin 44, pressed at its one and the other ends respectively against the connection terminals 22c and 26a of the circuit board 22 and the probe board 26, is surely brought into contact with those connection terminals. As a result, the state of the electrical connection with each first connecting pin 44b and the connection terminal 22c is stabilized, at the same time stabilizing the state of electrical connection of the second connecting pin 44c and the connection terminal 26a is stabilized.

The contact 52 provided in each probe land 26b is electrically connected to the corresponding connection terminal 22c of the circuit board 22. As a result, when the tip end of the contact 52n brought into contact with the connection terminal of the device under test 12, this connection terminal is connected to the tester through the corresponding connector 36, so that the device under test can undergo the test of the electric circuit by the tester.

During the test, the connecting pin 44 disposed in each through hole 42 of the second group is shielded from the exterior by the earth pattern 46. As a result, mixing of external noises into an electric signal passing the signal connecting pin 44 disposed in the through hole 42 of the second group is restrained and prevented.

Particularly, when the earth pattern 46 is formed on each of the upside and underside of the electrical insulating plate 40, mixing of external noises into an electrical signal passing through the signal connecting pin is surely restrained and surely prevented.

When forming a conductive path on the probe board 26 or forming a multilayer circuit board on the ceramic board, it sometimes causes deformation such as a wave-like curve to the flat ceramic board due to the heat and external force in the production process. Also, it sometimes occurs that a curving deformation is already caused to the ceramic board itself before forming the conductive path and multilayer circuit board.

Deformation of the probe board 26 due to deformation of such a ceramic board is maintained even in a free state where no external force acts on the probe board 26.

In the embodiment shown, though the probe board 26 has such deformation, the tip ends of all the contacts 52 are uniformed beforehand so as to align on the same level, i.e., same plane in a free state with the deformation maintained. Preferably, this plane is parallel to an imaginary plane of a flat ceramic board which can be obtained when no deformation is generated in the ceramic board.

The probe board 26 having the contacts 52 with their tip ends uniformed is supported on the support member 20 through a plurality of male screw members 64 in a state of maintaining the deformation. Each male screw member 64 penetrates the support member 20 and the circuit board 22 from above downward, and the tip end portion of the screw member 64 reaches the inside of the electrical connecting device 24.

For the support by the male screw member 64, a plurality of anchors 66 are fixed with an adhesive on the upside of the probe board 26 (particularly, the ceramic board). Each anchor 66 has a female screw hole for receiving the tip end portion of each male screw member 64, is made of an electrical insulating material, and projected downward into the electrical connecting device 24.

The top surfaces of the respective anchors 66 are aligned to coincide with the same plane parallel to the imaginary plane in a free state of the probe board 26 with the curving deformation maintained. Thus, the height dimensions of the respective anchors 66 from the probe board 26 are different according to the height positions from the probe board 26 of the portions of the anchor members 66 with the deformation.

On the circuit board 22 and electrical connecting device 24 are formed through holes 70 (see FIG. 6) for receiving cylindrical spacers 68 and the anchor members 66. Each male screw member 64 penetrates the spacer 68 with the head portion located on the side of the support member 20 and is screwed into the corresponding anchor member 66 at its tip end portion.

The respective spacers 68 have the same length dimension. Each lower end of the spacer 68 is brought into contact with the top surface of the corresponding anchors 66, and each upper end of the spacer 68 abuts the underside 20a of the support member 20 as a reference mounting plane.

Thus, by tightening the male screw member 64 from above the support member 20, by a spacer action of the anchors 66 into which the tip end portion of the male screw member 64 is screwed and the spacer 68 disposed on each anchors 66, the probe board 26 is surely supported on the support member 20 such that the imaginary plane of the tip ends of the contacts 52 are parallel to the reference plane in a state that the probe board 26 maintains the curving deformation.

Thus, the tip ends of the contacts 52 of the probe board 26 are assembled into the electrical connecting apparatus 10 with those tip ends aligned on a plane parallel to the imaginary plane. As a result, the tip ends of the contacts 52 can be uniformly pushed against the corresponding connection terminals of the device under test 12, thereby enabling to conduct an electrical test of the electric circuit of the device under test adequately and easily.

In the electrical connecting apparatus 10, the support member 20 serves to reinforce the circuit board 22 held on its underside 20a, but in the test under a high-temperature environment, the central portion of the support member 20 tends to have a downward convex deformation due to thermal deformation accompanying temperature rise and weights of the electrical connecting device 24, probe board 26 and the like.

In the electrical connecting apparatus 10, however, a thermal deformation restraining member 32 larger in thermal expansion coefficient than the support member 20 is fixed on the support member 20 with the underside 32a (see FIG. 5) of the thermal deformation restraining member 32 brought into contact with the upside of the outer annular portion 20c. Thus, under a high-temperature environment, though the thermal deformation restraining member 32 tends to extend more greatly than the support member 20, the underside 32a of the thermal deformation restraining member 32 is put under restraint from extension by the support 20 member smaller in thermal expansion coefficient than the thermal deformation restraining member 32.

Therefore, since the upside 32b (see FIG. 5) to be a free plane of the thermal deformation restraining member 32 tends to extend more than the underside 32a under restraint, a difference in stress shows a tendency that the central portion of the free plane generally expands in a convex shape to be away from the support member 20. The action force due to this difference in stress acts as a force to restrain a downward convex deformation in the central portion of the support member 20.

As a result, by providing the thermal deformation restraining member 32, a downward expansion due to the thermal deformation of the support member under a high-temperature environment is restrained, so that the expansion deformation of the probe board 26 accompanying this deflection of the support member 20 can be restrained.

EMBODIMENT 2

Figure 8:
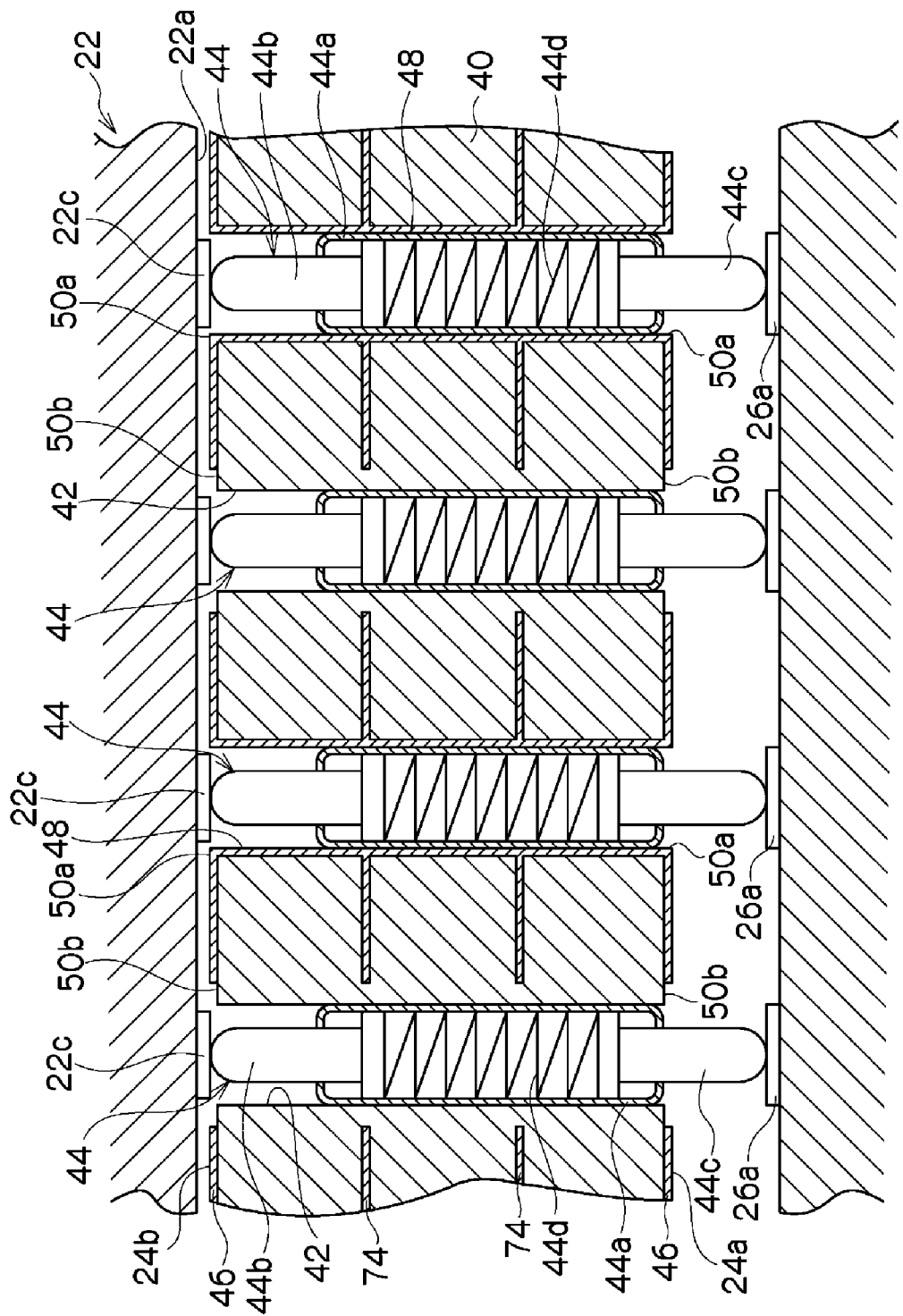
FIG. 8 is an enlarged sectional view showing the second embodiment of the electrical connecting device according to the present invention.

Referring to FIG. 8, the electrical connecting device 24 may further have at least one earth pattern 74 inside the electrical insulating board 40. The earth pattern 74 can be formed as a conductive layer by making the electrical insulating board 40 of a multilayer wiring board.

The earth pattern 74 is electrically connected to both earth patterns 46 and the electrical insulating film 48, but is electrically separated from each connecting pin 44 disposed in the through hole 42 of the second group by similar method as both earth patterns 46.

By providing further such an earth pattern 74 inside the electrical insulating board 40, mixing of external noises into an electric signal passing the signal connecting pin 44 can be more surely restrained and more surely prevented.

EMBODIMENT 3

Figure 9:
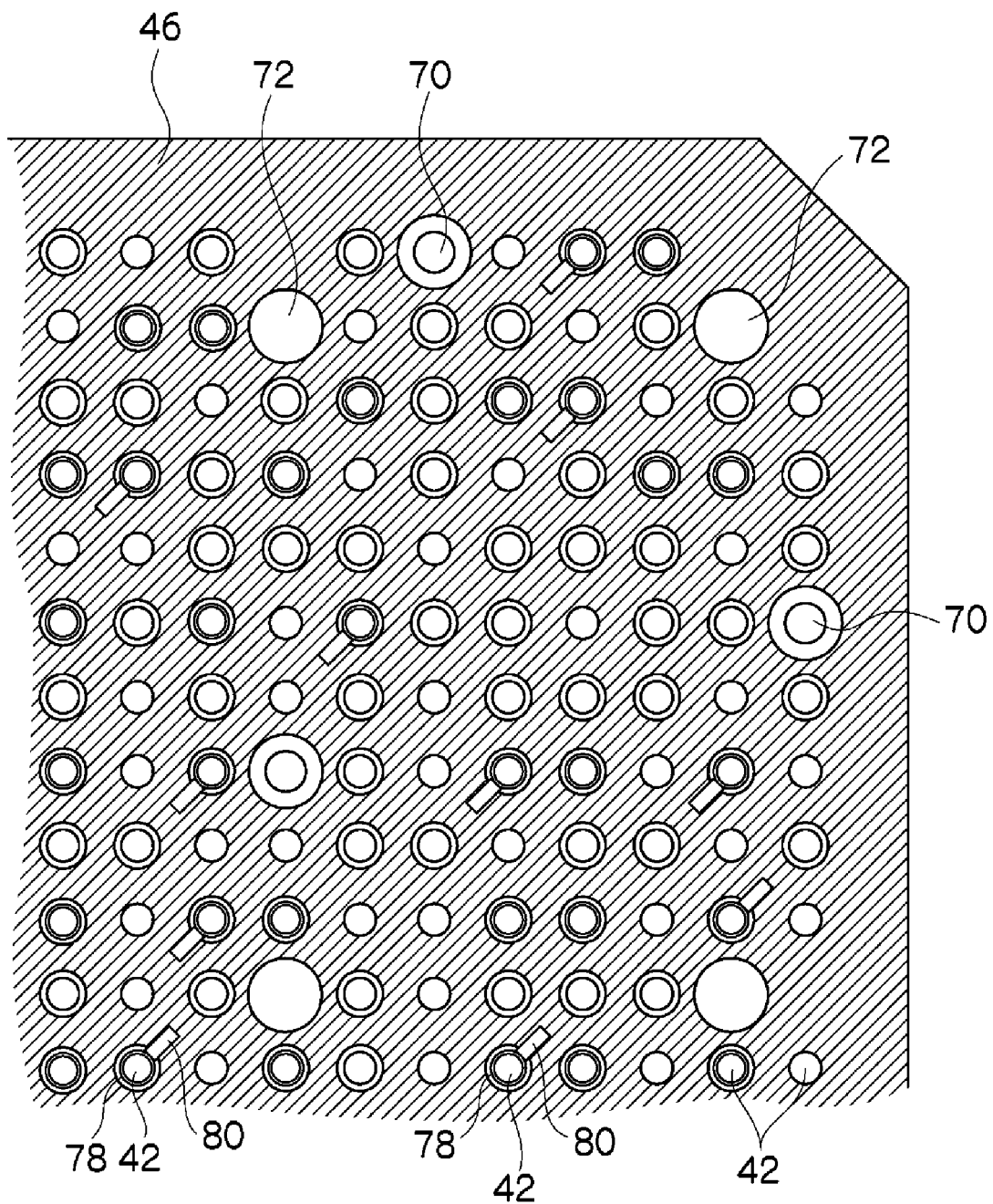
FIG. 9 is a bottom view showing a part of the third embodiment of the electrical connecting device according to the present invention.
Figure 10:
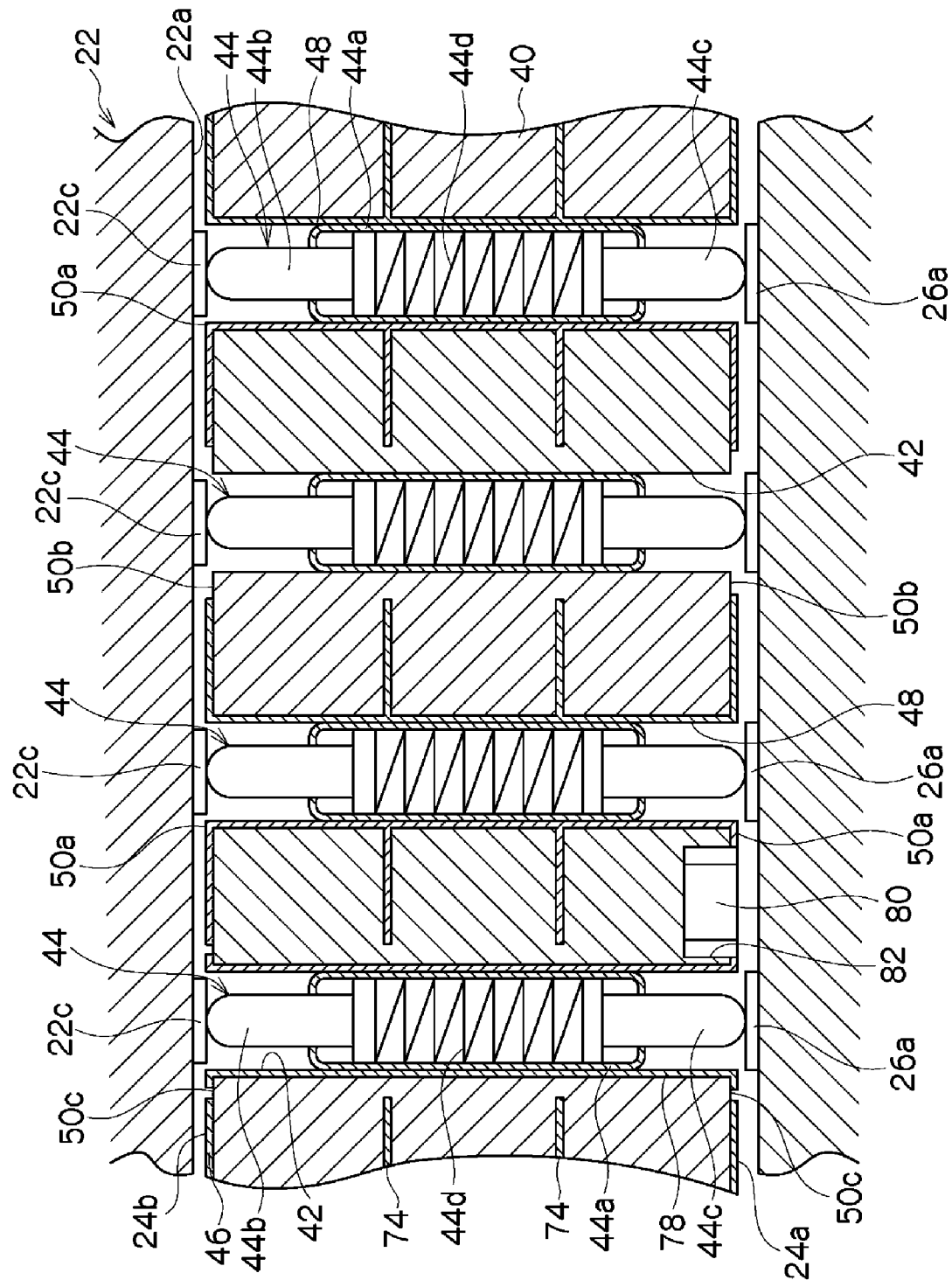
FIG. 10 is an enlarged sectional view of the electrical connecting device shown in FIG. 9.
Figure 11:
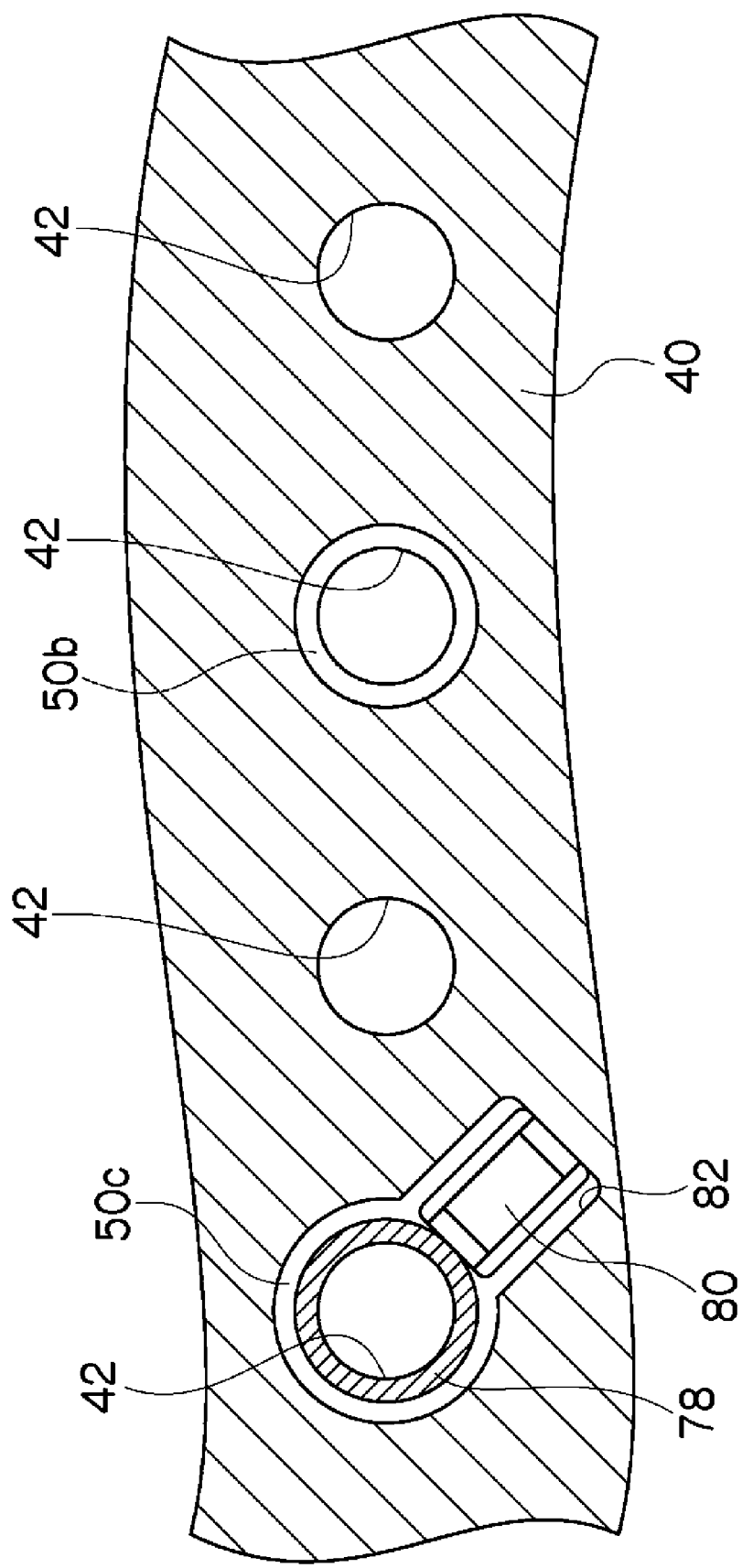
FIG. 11 is a partially enlarged bottom view of the electrical connecting device shown in FIG. 9.

Referring to FIGS. 9, 10 and 11, the electrical connecting device 24 can further include a conductive membrane 78 formed inside a part of the through holes 44 of the second group, and a plurality of capacitors 80 disposed near the part of the through holes 44 with the membrane 78 formed and at the lower portion of the electrical insulating plate 40.

The electrical insulating plate 40 has a plurality of recesses 82 near a part of the through holes 44 of the second group. Each recess 82 is opened downward. Each capacitor 80 is accommodated in the recess 82 in correspondence to a state that a part thereof is exposed under the electrical insulating plate 40.

Each of the earth patterns 46, 74 is electrically separated from the membrane 78 with a part cut out in a portion 50c in the vicinity of the part of the through holes 44 of the second group.

Each capacity 80 is electrically connected to the earth pattern 46 with one electrode formed on the underside of the electrical insulating plate, while the other electrode is electrically connected to the connecting pin 44 disposed in the through hole 42 near the recess 82 through the membrane 78.

The connecting pin 44 disposed in the through hole 42 having the membrane 78 is brought into contact with the membrane 78 and electrically connected to the membrane 78.

In this embodiment, at least the connecting pins 44 connected to the capacitor 80 are used for positive or negative terminal of the source, and the remaining connecting pins 44 of the second group are used for signal. Thus, not only the signal connecting pin 44 but also the source connecting pin 44 is electrically separated from the earth pattern 46.

In place of accommodating all the capacitors 80 in the lower portion of the electrical insulating plate 40, they may be accommodated in the upper portion or the inside of the electrical insulating plate 40, or the plural capacitors 80 may be disposed or accommodated by dividing them into the lower portion, upper portion, and inside and the like of the electrical insulating plate 40.

In place of using the connecting pin 44 such as above, it is possible to omit either one of the first and second pin members 44b and 44c, and instead thereof, another connecting pin such as pin or the like using a connecting pin having a bottomed cylindrical member and the like may be used.

It is sufficient to provide the earth pattern at least on one of the upside, underside and inside of the electrical insulating plate 40.

The present invention is not limited to the above-mentioned embodiments but can be varied without departing from its purport.

The invention claimed is:

1. An electrical connecting apparatus for connecting a tester and electrical connection terminals of a device under test to undergo an electrical test by said tester, comprising:
a wiring board having an upside, an underside, a plurality of wiring circuits to be connected to said tester, and connection terminals formed on the underside of said wiring board, each connection terminal being connected to said wiring circuits;
a flat plate-like probe board having an upside and an underside, the upside of said probe board being opposed to the underside of said wiring board, and said probe board having a plurality of electrical connection terminals on the upside of said probe board and having a plurality of probe lands on the underside of said probe board, each probe land being connected to said electrical connection terminals of the probe board;
a plurality of contacts provided on the underside of said probe board, each contact being connected to said probe lands, and having a tip end portion, and each tip end portion being able to abut on the electrical connection terminals of the device under test;
a support member disposed on the upside of said wiring board;
a thermal deformation restraining member disposed on said support member to restrain thermal deformation of said support member and having a coefficient of thermal expansion greater than that of said support member; and
an electrical connecting device disposed between said wiring board and said probe board and for connecting the connection terminals of said wiring board to the electrical connection terminals of said probe board, said electrical connecting device comprising:
an electrical insulating plate having at least a first and a second groups each including a plurality of through holes penetrating said electrical insulating plate in its thickness direction; and
a plurality of conductive connecting pins, each pin being disposed in the through hole, and each pin having the upper end portion connected to the connection terminals of said wiring board and the lower end portion connected to the connection terminals of said probe board; wherein
said electrical insulating plate further has at least one of conductive earth patterns on at least one of the upside, underside and inside of said electrical insulating plate;
the connecting pin disposed in each through hole of said first group is connected to said earth pattern; and
the connecting pin disposed in each through hole of said second group is electrically separated from said earth pattern.

2. The electrical connecting apparatus claimed in claim 1, wherein said electrical insulating plate has said earth pattern formed on each of the upside, underside and inside of said electrical insulating plate.

3. The electrical connecting apparatus claimed in claim 1, further comprising a plurality of capacitors accommodated in at least one of the lower portion, inner portion and upper portion of said electrical insulating plate, wherein each capacitor is electrically connected to said earth pattern and the connecting pin disposed in a part of the through holes of said second group.

4. The electrical connecting apparatus claimed in claim 1, wherein said thermal deformation restraining member is combined with said support member by means of a plurality of screw members penetrating said thermal deformation restraining member.

5. The electrical connecting apparatus claimed in claim 1, further comprising:
a base ring having a central opening for receiving said electrical connecting device and disposed on the underside of said wiring board; and
a fixed ring having a central opening for receiving said probe board and disposed on the underside of said base ring by means of a plurality of screw members penetrating said fixed ring and screwed into said base ring; wherein
said probe board is sandwiched between said base ring and said fixed ring.

6. The electrical connecting apparatus claimed in claim 1, wherein said electrical insulating plate has said earth pattern on each of the upside and underside of said electrical insulating plate to be electrically connected to each other.

7. The electrical connecting apparatus claimed in claim 6, wherein said electrical insulating plate further includes a conductive film formed on the inner surface of at least one of the through holes of said first group and connected to said earth pattern, and the connecting pin disposed in each through hole of said first group is in contact with said conductive film.

8. The electrical connecting apparatus claimed in claim 1, wherein each connecting pin includes a cylindrical member, a first pin member disposed movably in the longitudinal direction of said cylindrical member, and a compression coil spring disposed within said cylindrical member and energizing said first pin member in a direction that its tip end portion projects from one end portion of said cylindrical member.

9. The electrical connecting apparatus claimed in claim 8, wherein each connecting pin further includes a second pin member disposed movably in the longitudinal direction of said cylindrical member at the other end portion of said cylindrical member, said compression coil spring being disposed between said first and second pin members and further energizing said second pin member in a direction that its tip end portion projects from the other end portion of said cylindrical member.

10. The electrical connecting apparatus claimed in claim 1, wherein said electrical connecting device is supported on said support member through a plurality of screw members penetrating said electrical connecting device and said circuit board and screwed into said support member.

11. The electrical connecting apparatus claimed in claim 10, wherein said base ring and said fixed ring are supported on said support member through a plurality of screw members penetrating said support member and said circuit board and screwed into said base ring.

12. An electrical connecting apparatus for connecting a tester and an electrical connection terminal of a device under test to undergo an electrical test, comprising:

a circuit board on which a plurality of wiring circuits to be connected to said tester are formed and an electrical connection terminal of each wiring circuit is formed on the underside;

a flat plate-like probe board having an upside and an underside, the upside being opposed to the underside of said circuit board and having a plurality of electrical connection terminals opposed to the connection terminals of said circuit board, and the underside of said probe board having a plurality of probe lands;

a plurality of contacts provided on the underside of said probe board, each contact being connected to the connection terminals of said device under test, and the tip end portion of each contact being able to abut the probe lands of said probe board;

a support member disposed on said circuit board;

a thermal deformation restraining member disposed on said support member to restrain thermal deformation of said support member and having a thermal expansion coefficient greater than that of said support member; and an electrical connecting device disposed between said circuit board and said probe board and for connecting the connection terminals of said circuit board to the corresponding contacts; wherein said electrical connecting device comprises:

an electrical insulating plate having at least a first and a second groups each including a plurality of through holes penetrating said electrical insulating plate in its thickness direction; and a plurality of conductive connecting pins, each of said pins being disposed in each through hole, and having the upper end portion projecting from said insulating plate in the upward direction and the lower end portion projecting from said insulating plate in the downward direction; wherein said electrical insulating plate farther has at least one of conductive earth patterns on at least one of the upside, underside and inside of said electrical insulating plate;

the connecting pin disposed in each through hole of said first group is connected to said earth pattern; and the connecting pin disposed in each through hole of said second group is electrically separated from said earth pattern.

* * * * *